(12) United States Patent
Christopherson et al.

(10) Patent No.: US 6,510,960 B1
(45) Date of Patent: Jan. 28, 2003

(54) CAPTIVE SLIDABLE ACCESS COVER

(75) Inventors: David G. Christopherson, Raleigh, NC (US); Ronald A. Banister, Raleigh, NC (US)

(73) Assignee: Square D Company, Palatine, IL (US)

( * ) Notice: Subject to any disclaimer, the term of this patent is extended or adjusted under 35 U.S.C. 154(b) by 0 days.

(21) Appl. No.: 09/648,269

(22) Filed: Aug. 25, 2000

(51) Int. Cl.[7] .............................................. B65D 43/20
(52) U.S. Cl. ................. 220/345.3; 220/351; 220/345.4; 292/84
(58) Field of Search ........................... 220/345.1, 345.2, 220/345.3, 345.4, 350, 351, 281, 326; 224/281; 312/296; 292/DIG. 11, DIG. 30, 80, 81, 84, 87

(56) References Cited

U.S. PATENT DOCUMENTS 2,663,457 A * 12/1953 Shaffer
3,240,373 A * 3/1966 Dulle
3,651,979 A * 3/1972 Severson
4,449,474 A * 5/1984 Mariol
4,997,103 A * 3/1991 Daly
5,082,137 A * 1/1992 Weinstein
5,275,291 A * 1/1994 Sledge
5,497,893 A * 3/1996 Mangone, Jr.
5,843,595 A * 12/1998 Kawakatsu

* cited by examiner

Primary Examiner—Nathan J. Newhouse
(74) Attorney, Agent, or Firm—David R. Stacey; Larry T. Shrout; Larry I. Golden

(57) ABSTRACT

A captivated slidable access cover incorporates an integral cantilevered spring to prevent undesired movement resulting from gravitational forces or vibration. The cover has two generally parallel, opposed edges which are slidingly captivated in opposed tracks of the enclosure. The integrally formed cantilevered spring is located adjacent one end of the cover and biases the cover to be in one of a positively open position or a positively closed position. The cantilevered spring presses against a portion of the enclosure at or adjacent one end of the access opening defined in the enclosure. The biased interaction between the cantilevered spring and the enclosure ensures a positive open or closed position of the cover. The cover also includes a handle at its other end for slidably opening and closing the cover.

21 Claims, 5 Drawing Sheets

CAPTIVE SLIDABLE ACCESS COVER

FIELD OF THE INVENTION

The present invention relates to enclosures for electronic devices, and particularly to access covers for those electronic devices.

BACKGROUND OF THE INVENTION

Many of today's electronic devices require configuration changes or other expected modifications during their operational lifetime. It is common to provide an opening in the enclosure of the electronic device through which these reconfigurable jumpers or other user modifiable components can be accessed. Some type of cover is generally provided for the access opening to prevent foreign objects from entering the enclosure. These covers have commonly snap-in plugs, hinged covers or sliding covers. Each has its own problem. The snap-in plug type covers are generally not permanently attached to the enclosure and are therefore easily lost when removed for reconfiguring the electronic device. Hinged covers are sometimes an obstacle to the operation being performed or the hinge is easily broken, making the cover unusable or, at best, equivalent to a snap-in cover. Sliding covers are generally captivated in some manner and therefore not easily lost. They can be susceptible to the effects of gravity depending on the orientation of the electronic device or in some applications vibration. Either of these effects can cause the sliding cover to open or close at inappropriate times. It is therefore desirable to provide an access opening cover that is captivated to the enclosure, is not obstructive when open, and is not subject to the effects of gravity or vibration.

SUMMARY OF THE INVENTION

The slidable captive access cover of the present invention incorporates an integral cantilevered spring which prevents movement due to gravitational forces or vibration and which is not an obstruction when open. The cover has two generally parallel opposed edges which are slidingly captivated in opposed tracks of the enclosure. The integrally formed cantilevered spring is located adjacent one end of the cover and biases the cover to be in one of a positively open position or a positively closed position. The cover also includes a handle at the other end for slidably opening and closing the cover. The cantilevered spring operates against a portion of the enclosure at one end of the access opening defined in the enclosure and which the access cover selectively opens or closes.

Figure 1:
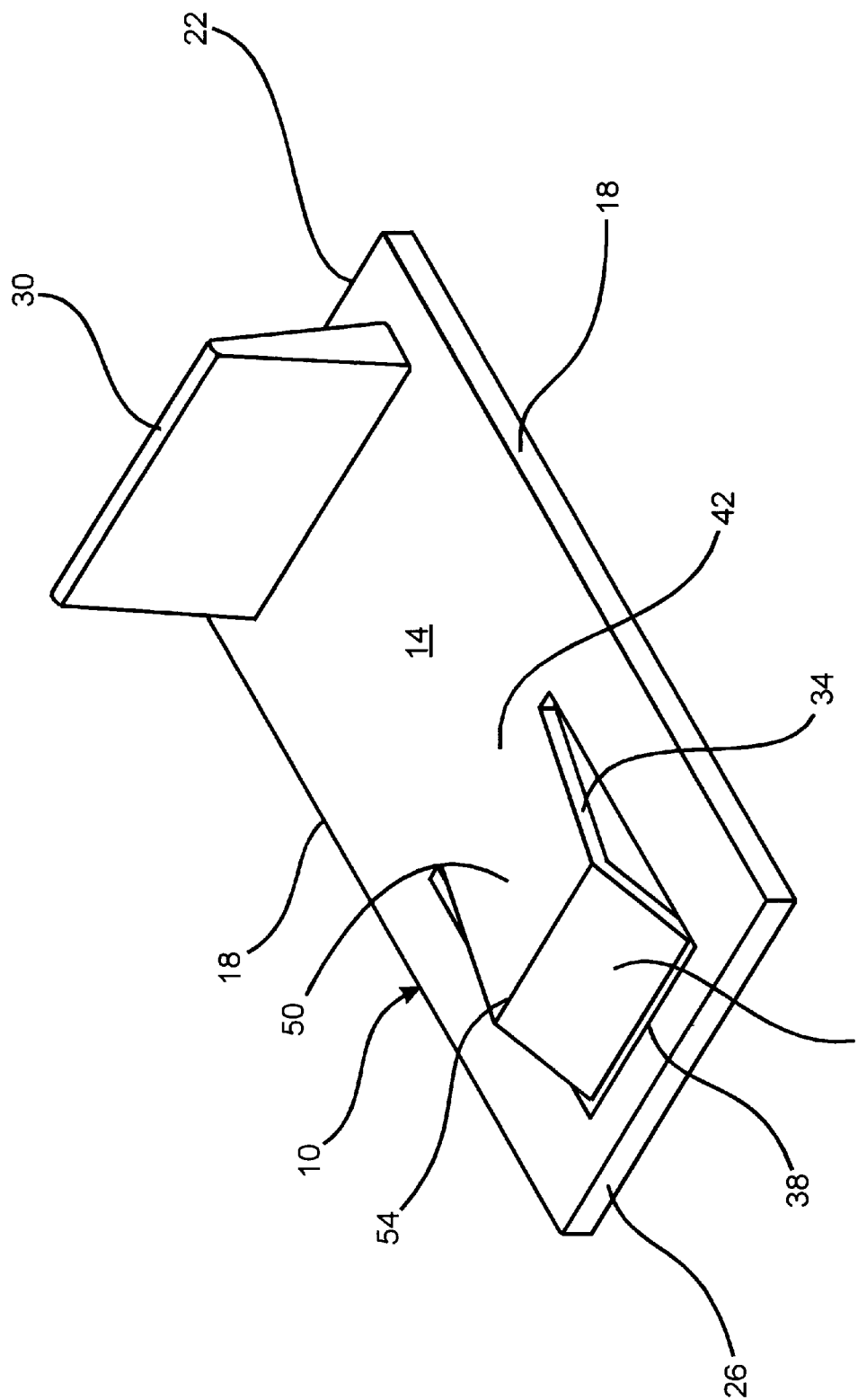
FIG. 1 illustrates a slidable access cover constructed in accordance with the present invention.

Before one embodiment of the invention is explained in detail, it is to be understood that the invention is not limited in its application to the details of construction described herein or as illustrated in the drawings. The invention is capable of other embodiments and of being practiced or being carried out in various other ways. Further, it is to be understood that the phraseology and terminology used herein is for the purpose of description and should not be regarded as limiting.

DETAILED DESCRIPTION OF THE DRAWINGS

FIG. 1 illustrates, in its simplest form, an access cover generally indicated by reference numeral 10, constructed in accordance with the present invention. The cover 10 includes a generally flat surface 14 bounded by two generally parallel edges 18 intermediate a first end 22 and a second end 26. Adjacent the first end 22 is an integrally formed handle 30, extending outwardly from the generally flat surface 14 to permit easy sliding movement of the cover 10 between an open position and a closed position. Adjacent the second end 26 is an integrally formed cantilevered spring 34. The cantilevered spring 34 is formed such that an unattached end 38 is adjacent the second end 26 of the cover 10 and an attached end 42 is generally intermediate the unattached end 38 and the handle 30 at the first end 22 of the cover 10. The cantilevered spring 34 is angled generally upward between its unattached end 38 and its attached end 42, thus forming a first angled portion 46, a second angled portion 50 and a peak 54 extending above the generally flat surface 14.

Figure 2:
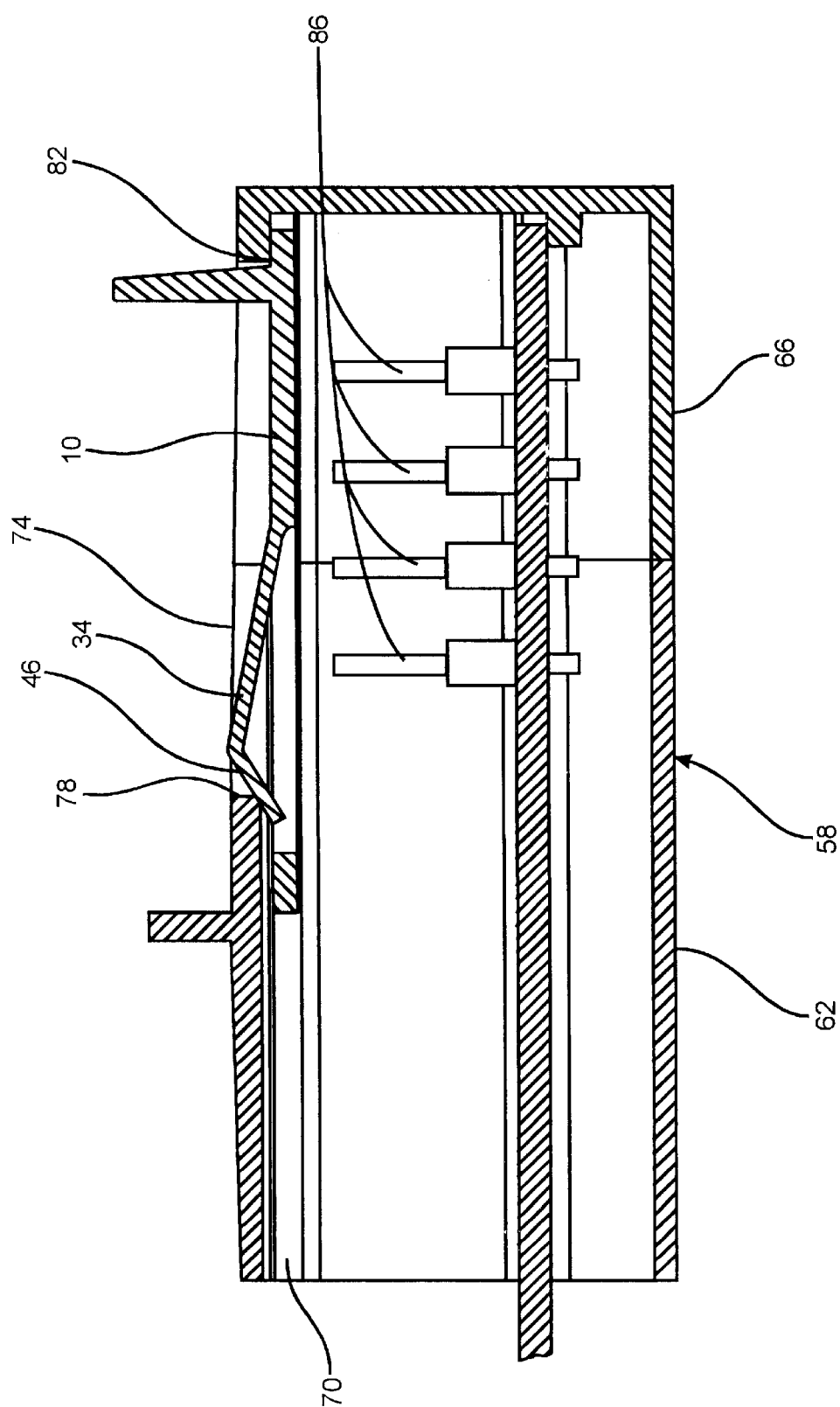
FIG. 2 is a cross-sectional view of the cover of FIG. 1 in the closed position in an enclosure adapted to receive the cover.

Referring now to FIG. 2, an enclosure 58 with a captivated cover 10 in the closed position is shown in cross-section. The enclosure 58 has at least a center or main portion 62 and at least one end portion 66 between which the cover 10 is captivated. The enclosure 58 has opposed tracks 70 (only one track is shown) that sliding receive and captivate the two parallel edges 18 of the cover 10. The enclosure 58 defines an access opening 74 having a first end 78 and a second end 82. The access opening 74 provides access to user configurable components 86, such as jumper pins (shown), dip switches or variable resistors, located inside the enclosure 58. As can be seen in FIG. 2, the cover 10 is maintained in the closed position by the biasing force of the first angled portion 46 of the cantilevered spring 34 pressing against the first end 78 of the access opening 74. The biased engagement of the first angled portion 46 and the first end of the access opening 74 positively maintains the cover 10 in the closed position regardless of gravitational forces due to orientation of the enclosure 58 or vibration.

Figure 3:
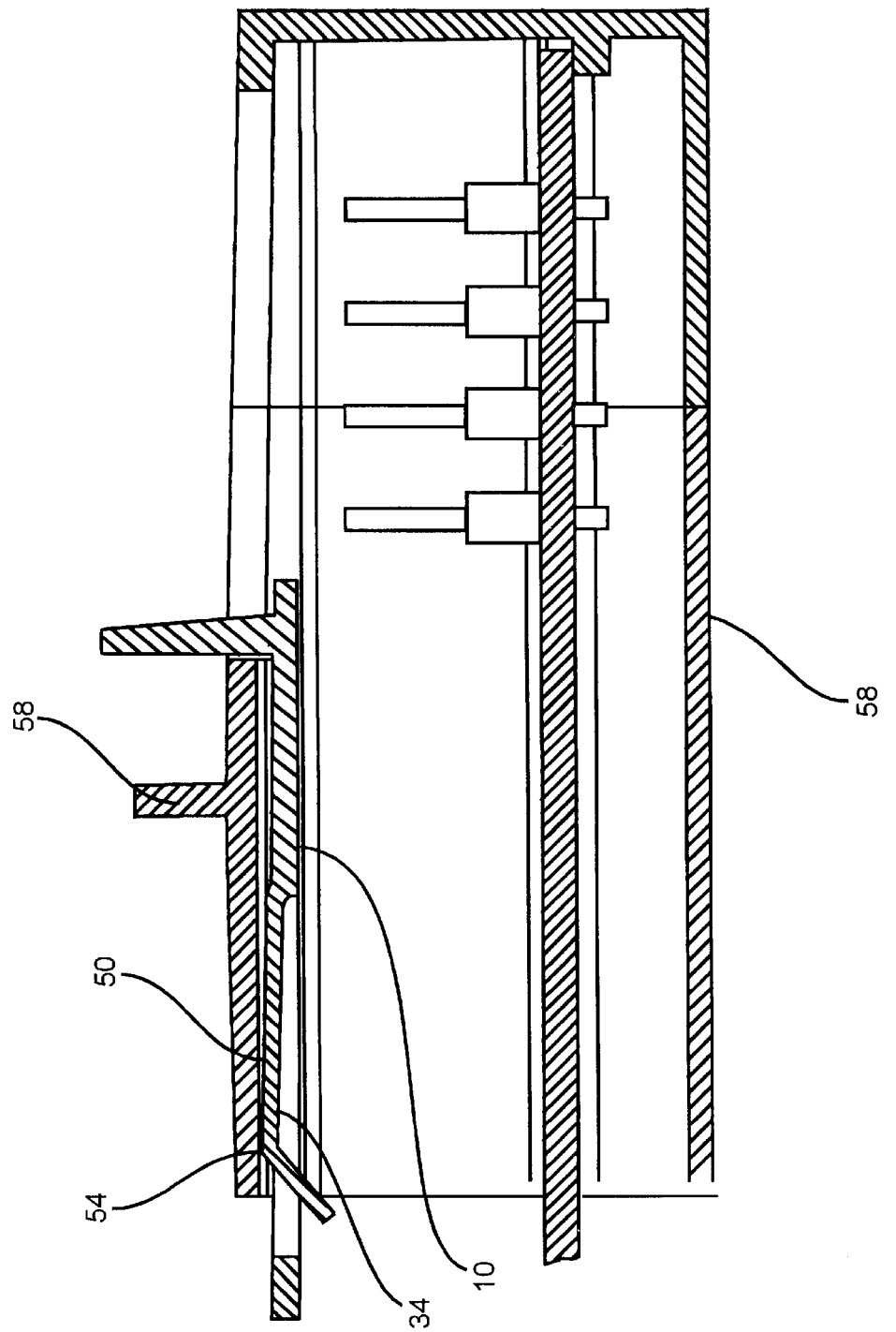
FIG. 3 is a cross-sectional view of the cover of FIG. 1 in the open position in an enclosure adapted to receive the cover.

Referring now to FIG. 3, the enclosure 58 and cover 10 are again shown in cross-section, but with the cover 10 in the open position. In the open position, the peak 54 and/or second angled portion 50 of the cantilevered spring 34 is biased against a portion of the enclosure 58 adjacent the first end 78 of the access opening 74. This frictional engagement between the cantilevered spring 34 and enclosure 58 positively maintains the cover 10 in the open position regardless of gravitational forces due to the orientation of the enclosure 58 or vibration.

Figure 4:
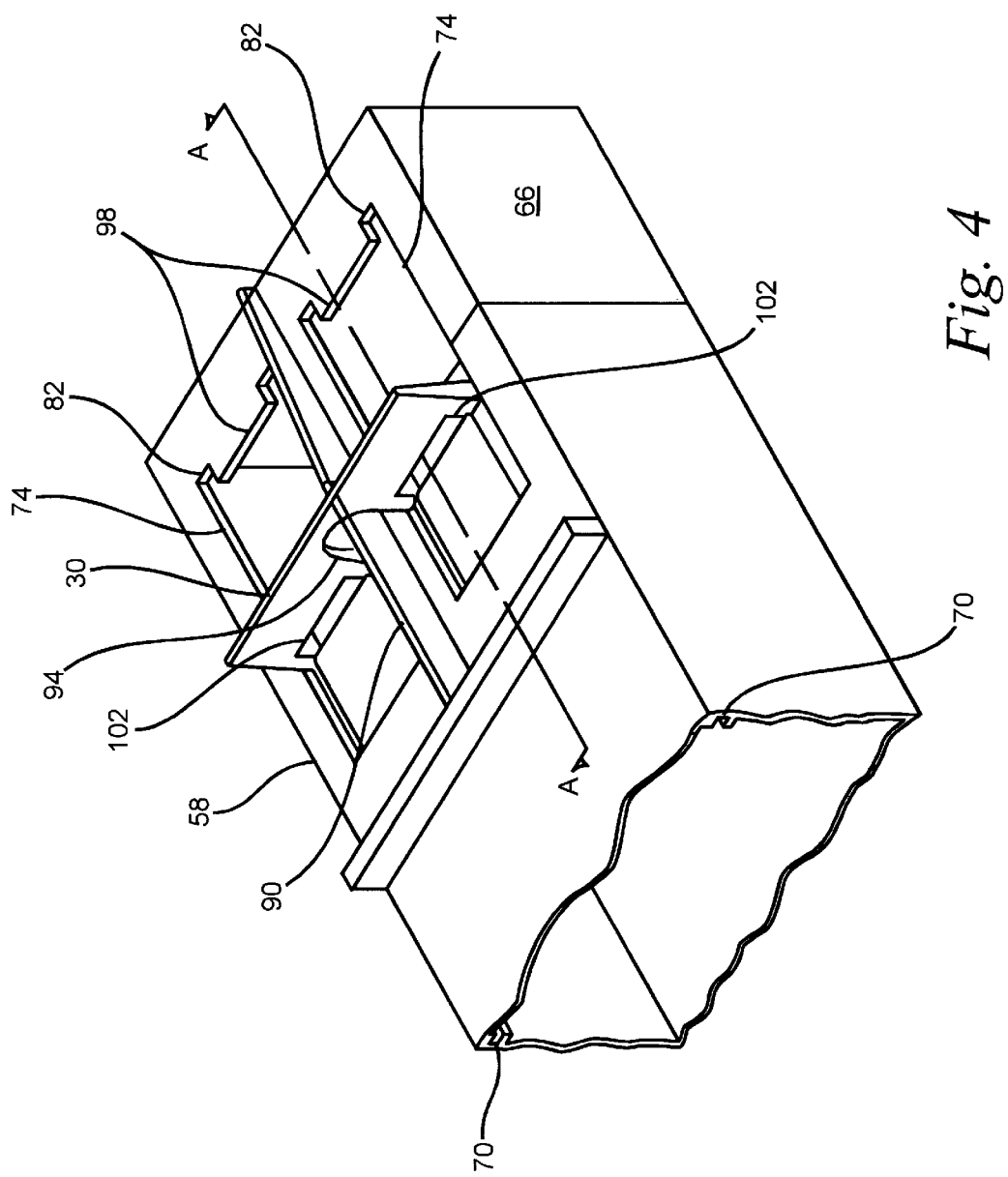
FIG. 4 illustrates a second embodiment of a slidable access cover constructed in accordance with the present invention.

FIG. 4 illustrates a second embodiment of the access cover 10 in which two adjacent access openings 74 are provided in the enclosure 58. The two adjacent access openings are separated by a rib-like portion 90 of the enclosure 58. The access cover 10 includes all of the features of the previously described embodiment and operates in the same manner, but includes additional features that will now be described. A passage 94 is provided in the handle 30 for receiving the rib-like portion 90, separating the adjacent access openings 74. A tab 98 extending into the access opening 74 from its second end 82 is received in a corresponding slot 102 at the base of the handle 30 when the access cover 10 is in the closed position. The tab 98 provides additional support to the access cover 10, especially if the opposed tracks 70 are omitted from the end portion 66 of the enclosure 58.

Figure 5:
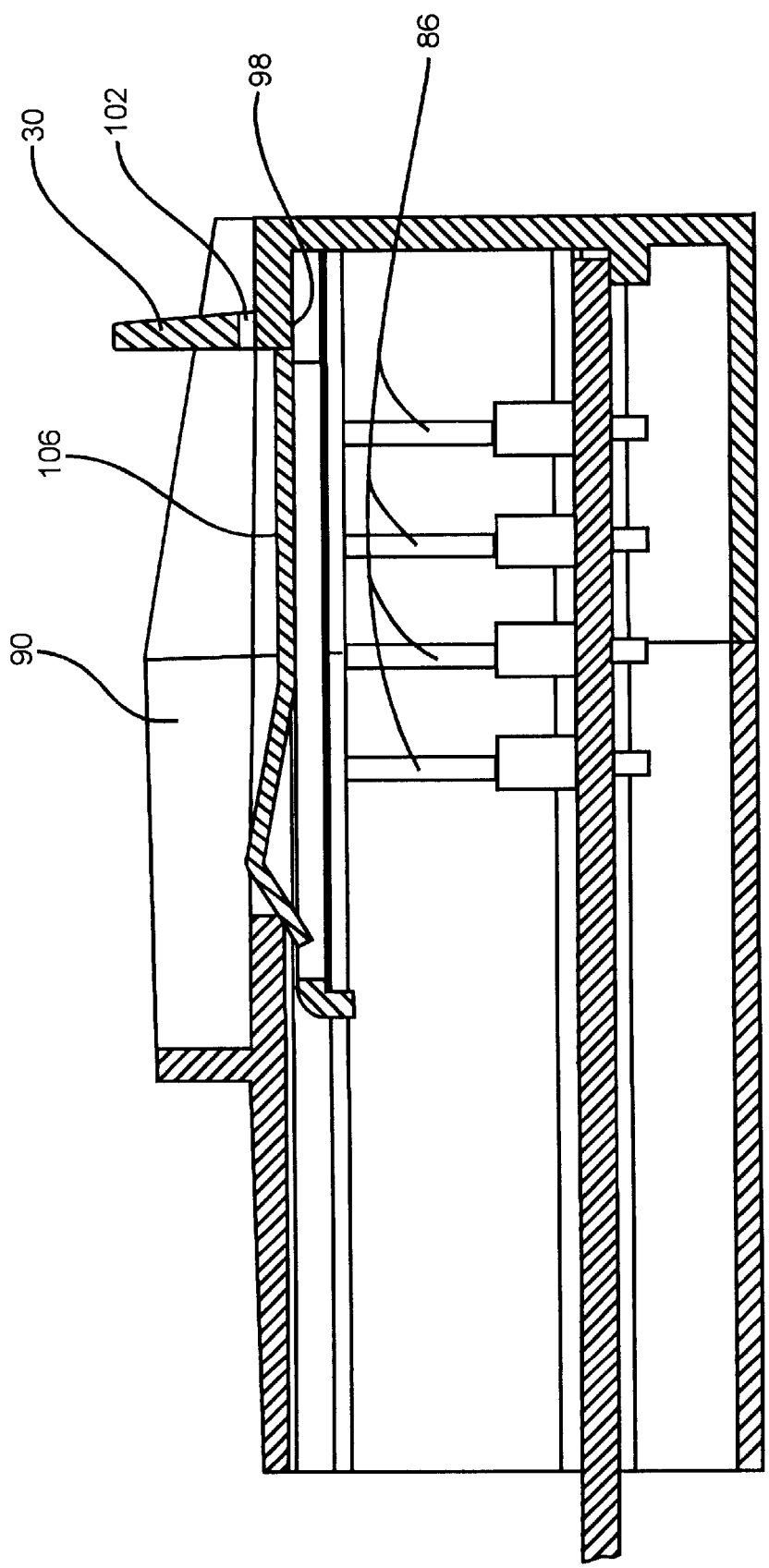
FIG. 5 is a cross-sectional view taken generally along line A—A of FIG. 4 showing the access cover in the closed position.

Referring now to FIG. 5, the cross-sectional view illustrates the cooperation of the tab 98 and slot 102. This view also illustrates a raised portion 106 of the access cover 10 that provides additional clearance for the electronic components 86. This raised portion 106 can also be slightly thinner that the two parallel edges 18 of the access cover 10.

We claim:

1. An access cover comprising:
    a generally flat surface defined by two generally parallel edges intermediate a first end and a second end;
    a handle extending outwardly from and generally perpendicularly to said generally flat surface at said first end;
    a cantilevered spring integrally formed from said generally flat surface and defined by an unattached end adjacent said second end of said access cover and an attached end, said cantilevered spring being generally angled upwardly between said unattached end and said attached end such as to form a first angled portion, a second angled portion and a peak at the junction of said first and second angled portions, said peak extending above said generally flat surface of said access cover; and
    an enclosure adapted to slidably receive said access cover, said enclosure defining an access opening to be selectively opened or closed by said access cover.

2. The access cover of claim 1 wherein said enclosure includes at least two mating parts configured such that said access cover is slidably captivated between two of said at least two mating parts.

3. The access cover of claim 1 wherein said two generally parallel edges of said access cover are slidably received within two opposed tracks defined in said enclosure for movement between an open position and a closed position.

4. The access cover of claim 1 wherein said access opening has a first end.

5. The access cover of claim 4 wherein said first angled portion of said access cover positively engages said first end of said access opening to maintain said access cover in a positive closed position.

6. The access cover of claim 4 wherein said peak and/or said second angled portion of said access cover engages a portion of said enclosure adjacent said first end of said access opening causing said access cover to be maintained in a positive open position.

7. The access cover of claim 4 wherein said access opening has a second end defining a tab, said tab extending into said access opening.

8. The access cover of claim 7 wherein said handle of said access cover further defines a slot, said slot dimensioned to receive said tab of said access opening when said access cover is in said closed position.

9. An access cover comprising:
    a generally flat surface defined by two generally parallel edges intermediate a first end and a second end;
    a handle extending outwardly from and generally perpendicularly to said generally flat surface at said first end;
    a cantilevered spring integrally formed from said generally flat surface and defined by an unattached end adjacent said second end of said access cover and an attached end, said cantilevered spring being generally angled upwardly between said unattached end and said attached end such as to form a first angled portion, a second angled portion and a peak at the junction of said first and second angled portions, said peak extending above said generally flat surface of said access cover; and
    an enclosure having two mating parts adapted to slidably receive and captivate said access cover, said two mating parts defining at least one access opening to be selectively opened or closed by said access cover.

10. The access cover of claim 9 wherein said two generally parallel edges of said access cover are slidably received within two opposed tracks defined in said enclosure for movement between an open position and a closed position.

11. The access cover of claim 9 wherein said at least one access opening has a first end.

12. The access cover of claim 11 wherein said first angled portion of said access cover positively engages said first end of said at least one access opening such that said access cover is biased to a positive closed position.

13. The access cover of claim 11 wherein said peak of said access cover engages a portion of said enclosure adjacent said first end of said at least one access opening to maintain a positive open position.

14. The access cover of claim 11 wherein said second angled portion of said access cover engages a portion of said enclosure adjacent said first end of said at least one access opening to maintain a positive open position.

15. The access cover of claim 11 wherein said at least one access opening has a second end defining a tab, said tab extending into said access opening.

16. The access cover of claim 15 wherein said handle of said access cover further defines a slot, said slot dimensioned to receive said tab of said at least one access opening when said access opening is closed by said access cover.

17. An access cover comprising:
    an enclosure adapted to slidably receive said access cover and defining at least one access opening to be selectively opened or closed by said access cover, said at least one access opening having a first end;
    a generally flat surface defined by two generally parallel edges intermediate a first end and a second end;
    a handle extending outwardly from and generally perpendicularly to said generally flat surface at said first end;
    a cantilevered spring integrally formed from said second end of said generally flat surface defined by slits inwardly spaced from said parallel edges, said spring configured for positive engagement with said first end of said at least one access opening such that a closed position of said access cover is maintained or with a portion of said enclosure adjacent said first end of said at least one access opening such that an open position of said access cover is maintained.

18. The access cover of claim 17 wherein said cantilevered spring includes an unattached end adjacent said second end of said access cover and an attached end generally intermediate said unattached end of said cantilevered spring and said first end of said access cover.

19. The access cover of claim 18 wherein said cantilevered spring is generally angled upwardly between said unattached end and said attached end such as to form a first angled portion, a second angled portion and a peak at the junction of said first and second angled portions, said peak extending above said generally flat surface of said access cover.

20. The access cover of claim 19 wherein said first angled portion of said cantilevered spring positively engages said first end of said at least one access opening such that said access cover is biased to a positive closed position.

21. The access cover of claim 19 wherein one or both of said peak or said second angled portion of said cantilevered spring engages a portion of said enclosure adjacent said first end of said at least one access opening to maintain a positive open position.

\* \* \* \* \*